United States Patent [19]

Kotecha et al.

[11] 4,329,186

[45] May 11, 1982

[54] SIMULTANEOUSLY FORMING FULLY IMPLANTED DMOS TOGETHER WITH ENHANCEMENT AND DEPLETION MODE MOSFET DEVICES

[75] Inventors: Harish N. Kotecha, Essex Junction, Vt.; Francisco H. DeLaMoneda, Stormville, N.Y.

[73] Assignee: IBM Corporation, Armonk, N.Y.

[21] Appl. No.: 105,673

[22] Filed: Dec. 20, 1979

[51] Int. Cl.³ .................. H01L 21/26; H01L 7/44; H01L 21/28

[52] U.S. Cl. ..................... 148/1.5; 29/571; 29/576 B; 148/187; 156/652; 357/23; 357/91

[58] Field of Search ............ 148/1.5, 187; 29/571, 29/576 B; 357/23, 91; 156/652

[56] References Cited

U.S. PATENT DOCUMENTS

| | | | |
|---|---|---|---|
| 3,940,288 | 2/1976 | Takagi et al. | 148/1.5 |
| 4,085,498 | 4/1978 | Rideout | 148/1.5 |
| 4,148,054 | 4/1979 | Hart et al. | 148/1.5 |
| 4,171,229 | 10/1979 | Simi et al. | 148/1.5 |
| 4,182,636 | 1/1980 | Dennard et al. | 148/187 |
| 4,221,044 | 9/1980 | Godejahn et al. | 29/571 |
| 4,249,968 | 2/1981 | Gardiner et al. | 148/174 |
| 4,280,855 | 7/1981 | Bertin et al. | 148/1.5 |
| 4,294,002 | 10/1981 | Jambotkar et al. | 29/571 |

*Primary Examiner*—Upendra Roy
*Attorney, Agent, or Firm*—John E. Hoel

[57] ABSTRACT

A semiconductor fabrication process and the resulting structure is disclosed for an FET device with a precisely defined channel length. Two process embodiments are described to make a diffused MOS device which does not require the use of p-type diffusions to obtain 1 micron channel length. Instead, to accurately define such micron-range channel lengths, a lateral etching technique is employed. To obtain well controlled threshold voltages, the channels are ion implanted. Thus the enhancement portion of the diffused MOS device channel is defined by an etching step instead of a diffusion step, thereby producing a channel having a length which is shorter and a threshold voltage which is better controlled than those which have been available in the prior art.

4 Claims, 16 Drawing Figures

SIMULTANEOUSLY FORMING FULLY IMPLANTED DMOS TOGETHER WITH ENHANCEMENT AND DEPLETION MODE MOSFET DEVICES

FIELD OF THE INVENTION

The invention disclosed is broadly related to semiconductor technology and is more particularly directed to an improved fabrication process for making field effect transistors and the resulting device.

BACKGROUND OF THE INVENTION

The prior art diffused MOS (DMOS) field effect transistor device uses subsequent p-type and n-type diffusions through the source window in order to get a highly doped channel length $L_E$ of about 1 micrometer with the remaining portion of the channel $L_D$ being at the low doping level of the original substrate, as is illustrated in FIG. 1. FIG. 1 shows a cross-sectional view of the prior art DMOS structure, with the p-type substrate 2 having diffused into it a p-type diffusion 4 and an n-type diffusion 6 through the same window in the oxide layer 10. While the source diffusion 6 is being diffused, the n-type drain 8 is also diffused through an adjacent window in the oxide layer 10. The double diffused p-type diffusion 4 and n-type diffusion 6 form an effective channel region 20 having a length $L_E$ which is the difference between the surface of the diffusion 6 and the surface of the diffusion 4. The effective channel region 20 for the device is an enhancement mode channel. The remaining portion 22 of the region of the p-type substrate 2 between the p-type diffusion 4 and the n-type drain diffusion 8 is the depletion mode portion of the channel for the FET device. Enhancement mode channel 20 and depletion mode channel 22 are covered by a thin silicon dioxide layer 12, over which is deposited the conductive gate electrode 18, thereby forming the DMOS FET device. Electrically conductive contacts 14 and 16 are respectively deposited through windows of the oxide layer 10 to contact the source diffusion 6 and drain diffusion 8.

The fabrication process for the prior art structure of FIG. 1 borrows the hot processes used to form the p-type base and n-type emitter of bipolar transistors. Thus the problems associated with photoengraving 1 micron channel lengths are circumvented by using the more complex bipolar processing. This approach to fabricating 1 micron long channels has not been widely used to make LSI arrays primarily because of the following reasons. First, the cost-performance advantage of MOS technology is reduced by using lower manufacturing yield bipolar processing. Secondly, the threshold voltage control of the prior art device is poor because the amount of dopant deposited and redistributed during processing is not well controlled as it is in conventional MOSFET devices using uniformly doped substrates or ion-implanted channels.

It has been shown by T. J. Rogers, et al., "An Experimental and Theoretical Analysis of Double-Diffused MOS Transistors," *IEEE Journal of Solid State Circuits*, October 1975, pages 322–331 that if the structure of FIG. 1 is to have an effective channel length of $L_E$ approaching the length of the channel 20 for the p-type diffusion 4, the following inequality must be satisfied $$\Delta V_T = (V_{TE} - V_{TD}) > \tfrac{1}{2} E_c L_D \tag{1}$$

where $V_{TE}$ and $V_{TD}$ are the threshold voltages corresponding to the length of the enhancement mode channel 20 of $L_E$ and the depletion mode channel 22 length of $L_D$, respectively, and $E_c$ is the critical electric field of $2 \times 10^4$ volts per centimeter. For instance, if $\Delta V_T = 2$ volts, then $L_D$ must be less than 2 microns in order to have DMOS device characteristics. If $\Delta V_T$ is to be large so that it is permissible to have $L_D$ several microns long, then $V_{TD}$ must be made as negative as possible. One way to satisfy this requirement is to use high resistivity substrates of up to 25 ohm centimeters. However, this approach is impractical because of possible punch-through problems and it precludes having conventional MOSFETs on the same chip due to short-channel effects. Another approach may be to lower the $V_{TD}$ by means of ion implantation. This has the drawback, however, that such an implantation should not overlap the enhancement mode channel region 20 and consequently the alignment tolerance for the implant blocking mask must be in the micrometer range which is the kind of stringent photolithographic specification that DMOS devices were designed to avoid.

OBJECTS OF THE INVENTION

It is therefore an object of the invention to provide an improved short-channel MOS device which avoids using bipolar-type processing techniques.

It is therefore another object of the invention to provide a field effect transistor having a minimum channel length.

It is still a further object to provide a field effect transistor having a minimum channel length, which does not require extremely high resistivity substrates.

It is still a further object of the invention to provide a field effect transistor having a minimum channel length wherein enhancement mode devices and depletion mode devices can be simultaneously formed.

It is yet a further object of the invention to provide a diffused MOS device wherein a given diffusion rail can serve as a drain or source contact.

It is still a further object of the invention to provide an improved field effect transistor with a minimum channel length having a minimum number of processing steps.

It is yet a further object of the invention to provide an improved field effect transistor having a minimum channel length, whose source-to-substrate junction capacitance is minimized.

SUMMARY OF THE INVENTION

These and other objects, features and advantages of the invention are provided by the fully implanted silicon gate DMOS structure and fabrication process disclosed herein. A semiconductor fabrication process and the resulting structure are disclosed for an FET device with a precisely defined channel length. Two process embodiments are described to make a diffused MOS device which does not require the use of p-type diffusions to obtain 1 micron channel length. Instead, to accurately define such micron-range channel lengths, a lateral etching technique is employed. To obtain well controlled threshold voltages, the channels are ion implanted. Thus the enhancement portion of the diffused MOS device channel is defined by an etching step instead of a diffusion step, thereby producing a channel having a length which is shorter and a threshold voltage which is better controlled than those which have been available in the prior art.

One process embodiment disclosed forms an FET device with a precisely defined channel length on a silicon substrate of a first conductivity type. The substrate is partitioned into device areas separated by regions of thick field oxide. The device areas have a first layer of silicon dioxide, a layer of polycrystalline silicon, a second layer of silicon dioxide, a layer of silicon nitride and a third layer of silicon dioxide deposited thereon. The process includes the steps of etching the polycrystalline silicon layer, the second oxide layer, the nitride layer and the third oxide layer so as to form a composite gate structure having a first edge and a second edge over the device area. The process continues by depositing source and drain regions of a second conductivity type opposite to the first conductivity type, aligned with the first and second edges, respectively, in the device area. The process then continues by laterally etching the silicon nitride layer beneath the third silicon dioxide layer, forming a reduced size silicon nitride layer having third and fourth edges displaced by a predetermined amount with respect to the first and second edges, respectively. The process continues by removing the third silicon dioxide layer and ion implanting a first drain extension of the second conductivity type which is contiguous with the drain region and has an edge defined by the third edge of the silicon nitride layer. The process then continues by growing a fourth silicon dioxide layer around the silicon nitride layer, having edges which are aligned with the third and fourth edges of the silicon nitride layer and then removing the silicon nitride layer. The process continues by ion implanting a second drain extension of the second conductivity type which is contiguous with the edge of the first drain extension and has an edge referenced with respect to the fourth edge of the silicon nitride layer. In this manner, a precisely defined channel length is created between the source region and the second drain extension.

Another process embodiment is a modification of the above, to carry out ion implantation for threshold voltage adjustment before depositing the relatively thick layer of polycrystalline silicon, to improve the precision in the resulting threshold voltage.

DESCRIPTION OF THE FIGURES

These and other objects, features and advantages of the invention will be more fully appreciated with reference to the accompanying figures.

DISCUSSION OF THE PREFERRED EMBODIMENT

Figure 1:
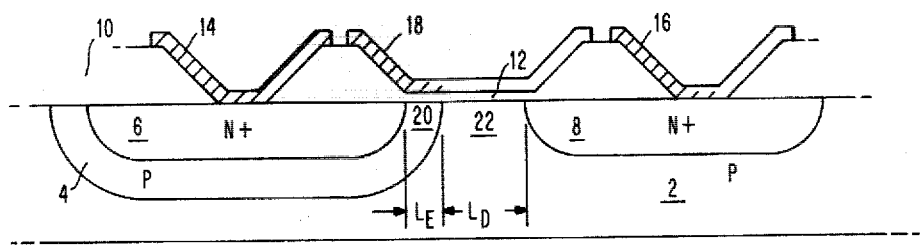
FIG. 1 is a cross-sectional view of a prior art diffused MOS device.

A semiconductor fabrication process and the resulting structure is disclosed for an FET device with a precisely defined channel length. Two process embodiments are described to make a diffused MOS device which does not require the use of p-type diffusions to obtain 1 micron channel length. Instead, to accurately define such micron-range channel lengths, a lateral etching technique is employed. To obtain well controlled threshold voltages, the channels are ion implanted. Thus the enhancement portion of the diffused MOS device channel is defined by an etching step instead of a diffusion step, thereby producing a channel having a length which is shorter and a threshold voltage which is better controlled than those which have been available in the prior art.

Two similar diffused MOS fabrication processes will be described which avoid the pitfalls in the prior art described above. With these inventive processes, bipolar transistor fabrication process steps are avoided, p-type diffusions are not needed, high resistivity substrates are not needed, and enhancement mode and depletion mode devices can be fabricated on the same integrated circuit chip with self-aligned polycrystalline silicon gates.

The first process embodiment disclosed forms an FET device with a precisely defined channel length on a silicon substrate of a first conductivity type. The substrate is partitioned into device areas separated by regions of thick field oxide. The device areas have a first layer of silicon dioxide, a layer of polycrystalline silicon, a second layer of silicon dioxide, a layer of silicon nitride and a third layer of silicon dioxide deposited thereon. The process includes the steps of etching the polycrystalline silicon layer, the second oxide layer, the nitride layer and the third oxide layer so as to form a composite gate structure having a first edge and a second edge over the device area. The process continues by depositing source and drain regions of a second conductivity type opposite to the first conductivity type, aligned with the first and second edges, respectively, in the device area. The process then continues by laterally etching the silicon nitride layer beneath the third silicon dioxide layer, forming a reduced size silicon nitride layer having third and fourth edges displaced by a predetermined amount with respect to the first and second edges, respectively. The process continues by removing the third silicon dioxide layer and ion implanting a first drain extension of the second conductivity type which is contiguous with the drain region and has an edge defined by the third edge of the silicon nitride layer. The process then continues by growing a fourth silicon dioxide layer around the silicon nitride layer, having edges which are aligned with the third and fourth edges of the silicon nitride layer and then removing the silicon nitride layer. The process continues by ion implanting a second drain extension of the second conductivity type which is contiguous with the edge of the first drain extension and has an edge referenced with respect to the fourth edge of the silicon nitride layer. In this manner, a precisely defined channel length is created between the source region and the second drain extension.

Figure 2:
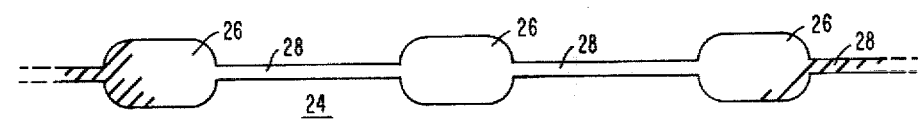
FIGS. 2 through 9 are a sequence of cross-sectional views of a semiconductor structure showing various steps in a first process embodiment culminating in a first embodiment of the inventive structure shown in FIG. 9.

The first inventive process is described with reference to the sequence of diagrams in FIGS. 2 through 9, culminating in the inventive device shown in FIG. 9. The process starts in FIG. 2 with a p-type substrate 24 having a resistivity in the range of 5 to 10 ohmcentimeters. A silicon dioxide layer is grown on the surface of the substrate 24 and a silicon nitride layer is deposited over the silicon dioxide layer and patterned with a first mask. The silicon nitride layer is selectively removed from the field regions using phosphoric acid. The wafer is then irradiated with a boron ion implant 30 to raise the threshold voltage of the field regions in preparation for the growth of a thick field silicon dioxide layer 26 having a thickness of approximately 4000 Å. The remaining silicon nitride layer and underlying silicon dioxide layer are removed by dip etching so that the areas intended for active devices and interconnections are left exposed. A silicon dioxide layer 28 is grown in these exposed regions as is shown in FIG. 2, to a thickness of between 500 to 1000 Å, suitable for use as the gate oxide layer for FET devices.

Figure 3:
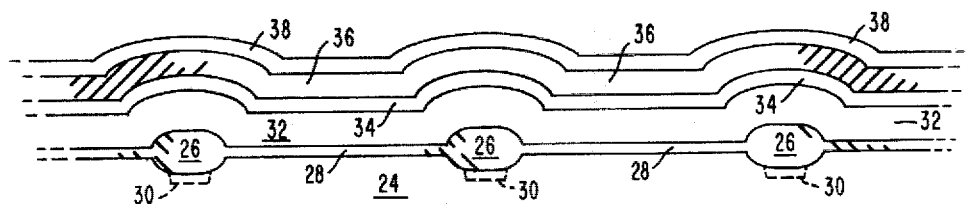

The first process continues as is shown in FIG. 3, with the deposition of a polycrystalline silicon layer 32 to a thickness of about 3000 Å over the entire wafer surface. This is followed by a subsequent chemical vapor deposition of a silicon dioxide layer 34 to about 1000 Å in thickness over the polycrystalline silicon layer 32. Then a silicon nitride layer 36 is deposited over the oxide layer 34 to a thickness of about 1500 Å. Finally, a silicon dioxide layer 38 is deposited to a thickness of about 1000 Å over the silicon nitride layer 36. The resulting structure is depicted in FIG. 3, which also shows the regions of the boron implantation 30 which was employed to raise the threshold voltage of the field regions in preparation for the growth of the thick field oxide 26, as previously mentioned.

The first process continues by employing a second mask and associated etching to form patterns for the gate electrodes and interconnections of the intended devices out of the polycrystalline silicon layer 32, silicon dioxide layer 34, silicon nitride layer 36, and silicon dioxide layer 38. The etching operation leaves exposed the surface of the substrate for the source, drain and diffusion rails to be formed in the next step. The multilayer structure shown in FIG. 4 comprised of the polycrystalline silicon gate region 32a, the silicon dioxide layer 34a, the silicon nitride layer 36a and the silicon dioxide layer 38a define the gate region for the diffused MOS device. An n-type dopant impurity such as phosphorous is diffused through the windows 40a and 42a formed on both sides of the multilayer structure, forming the source and drain regions 44a and 46a for the DMOS device.

One of the significant advantages of this first process is that conventional enhancement mode MOS devices and depletion mode MOS devices can be formed at the same time as the diffused MOS device. The etching step applied to the structure of FIG. 3 results in the formation of a multi-layer structure comprising a polycrystalline silicon gate region 32b, a silicon dioxide layer 34b, a silicon nitride layer 36b and a silicon dioxide layer 38b which define a gate region of an enhancement mode MOSFET device. The n-type dopant diffusion step which forms the source and drain regions 44a and 46a described above, also forms the source and drain regions 44b and 46b through the windows 40b and 42b, respectively, on both sides of the multi-layer structure for the enhancement mode MOSFET device shown in FIG. 4.

Figure 4:
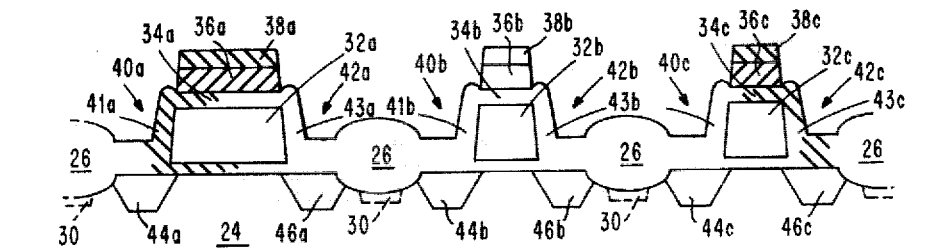

The depletion mode MOSFET device which is formed simultaneously with the diffused MOS device has a multi-layer structure formed by the etching step which is applied to FIG. 3, as is shown in FIG. 4. The multi-layer structure for the depletion mode MOSFET device comprises the polycrystalline silicon gate region 32c, the silicon dioxide layer 34c, the silicon nitride layer 36c, and the silicon dioxide layer 38c. The n-type impurity diffusion step which forms the diffused MOS source and drain regions also forms the source region 44c and the drain region 46c through the windows 40c and 42c, respectively, on both sides of the multi-layer structure for the depletion mode MOSFET device, as is shown in FIG. 4.

The n-type phosphorous diffusion step is done in an oxidizing atmosphere which forms a silicon dioxide layer on all exposed silicon surfaces, forming the sidewalls 41a and 43a for the polycrystalline silicon gate 32a of the DMOS device, the sidewalls 41b and 43b for the polycrystalline silicon gate region 32b of the enhancement mode MOSFET device, and the sidewalls 43b and 43c for the polycrystalline silicon gate region 32c of the depletion mode MOSFET device.

Figure 5:
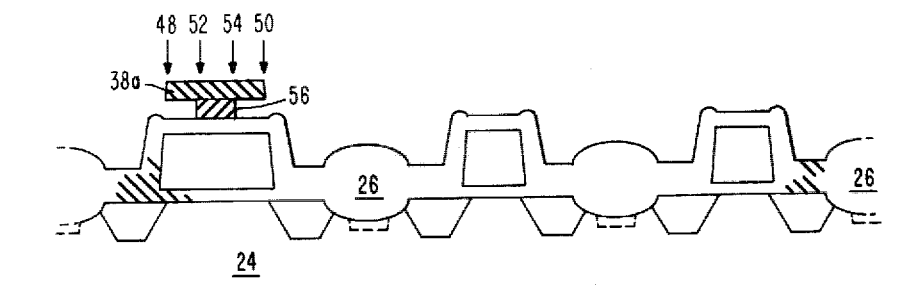

The first process continues by using the lateral etching technique described in U.S. Pat. No. 3,940,288 to Takagi, et al. The wafer is dipped in warm phosphoric acid which can only remove the sidewalls of the silicon nitride layers 36a, 36b, and 36c, since the top silicon dioxide layer 38a, 38b and 38c, respectively mask the top surfaces of the silicon nitride layers. The duration of this phosphoric acid etching step is timed so as to remove the silicon nitride layers 36b and 36c and, since the width of the silicon nitride layer 36a is greater than that for the layers 36b and 36c, to precisely cut a groove extending sideways about 1 micron into both sides of the silicon nitride layer 36a, as is shown in FIG. 5. The silicon dioxide layer 38a has outside edges 48 and 50 as shown in FIG. 5 which serve to mask the top of the silicon nitride layer 36a and to direct the direction of the etching laterally so that when the etching step is completed, the silicon nitride layer 36a is etched down to the silicon nitride structure 56 shown in FIG. 5 having the lateral edges 52 and 54.

The next step in the first process is to dip etch the wafer in diluted hydrofluoric acid to remove the remaining portions of the silicon dioxide layer 38a, 38b and 38c. The silicon nitride layer 56 serves as an etching mask which prevents the total removal of the silicon dioxide layer 34a, leaving a residual portion of the silicon dioxide layer 34a, numbered 58 in FIG. 6, beneath the silicon nitride layer 56. This pedestallike structure which is obtained on top of the DMOS polycrystalline silicon gate will serve as a precisely defined ion-implantation mask for the formation of source and drain extensions for the DMOS device. The edges 52 and 54 for the silicon nitride layer 56 are equidistant from the source 44a and the drain 46a of the DMOS device, by virtue of the lateral etching step of FIG. 5, which causes the lateral surfaces of the silicon nitride layer 36a to be etched inwardly at equal rates forming the silicon nitride layer 56. The edges 52 and 54 of the silicon nitride layer 56 are equidistant from the edge of the source 44a and the edge of the drain 46a because of the location of the deposition of the source 44a and drain 46a were referenced with respect to the original edges 48 and 50 of the original silicon nitride layer 36a. No masks have been used to define or locate the edges 52 and 54 of the silicon nitride layer 56 with respect to the edges of the source and drain regions 44a and 46a, respectively. The purpose of the silicon nitride layer 56 is twofold, first it accurately defines the enhancement channel length $L_E$ since the silicon nitride lateral etch rate is approximately 188 Å per minute and the desired channel length $L_E$ is 10000 Å, allowing a precise definition for the edges 52 and 54. Secondly, the silicon nitride layer 56 eliminates the need for precise alignment of the third and fourth masks to be described below. A cross-sectional view of the structure after the phosphoric acid etching step is shown in FIG. 6.

Figure 6:
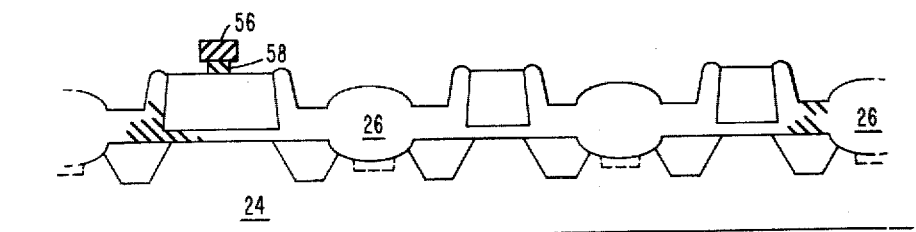
Figure 7:
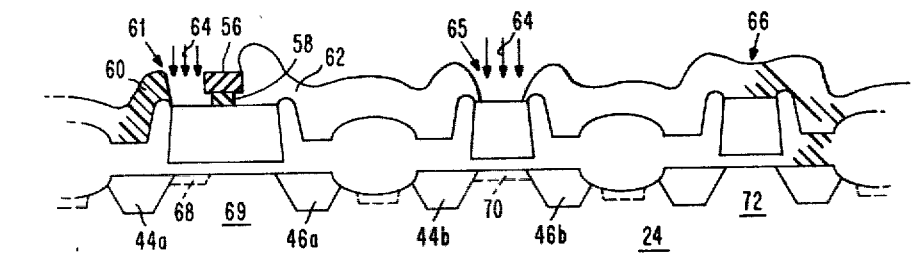

The first process continues by covering the structure of FIG. 6 with a positive photoresist layer 60 and 62 shown in FIG. 7 and a third photolithographic mask is used to expose the portion of the diffused MOS polycrystalline silicon gate 32a between the source diffusion 44a and the silicon nitride layer 56, through the window 61. An additional window 65 is formed for the polycrystalline silicon gate 32b for the enhancement mode MOSFET device as is shown in FIG. 7. A boron ion-implant step is then carried out through the window 61 and the window 65 to form the enhancement portion 68 of the diffused MOS device having a length $L_E$ which is defined by the separation distance between the edge 52 of the silicon nitride layer 56 and the edge of the source diffusion 44a. The boron ion implantation 64 also adjusts the threshold voltage of the enhancement mode MOSFET device by ion implanting boron ions through the polycrystalline silicon gate layer 32b and gate oxide 28 to form the increased p-type conductivity region 70 between the source 44b and the drain 46b in the p-type substrate 24 for the enhancement mode MOSFET device shown in FIG. 7. For the disclosed example of the structure, a 200 KeV boron ion implantation energy is sufficient. The resulting structure with its masks still in place is shown in FIG. 7. Note that the position of the edge for the photoresist layer 62 is not critical but can terminate anywhere along the top surface of the silicon nitride layer 56 and that the edge of the photoresist layer 60 can be located anywhere above the source diffusion 44a. The length $L_E$ of the enhancement portion 68 for the DMOS device is determined entirely by the location of the edge 52 for the silicon nitride layer 56 with respect to the proximate edge of the source diffusion 44a.

Figure 8:
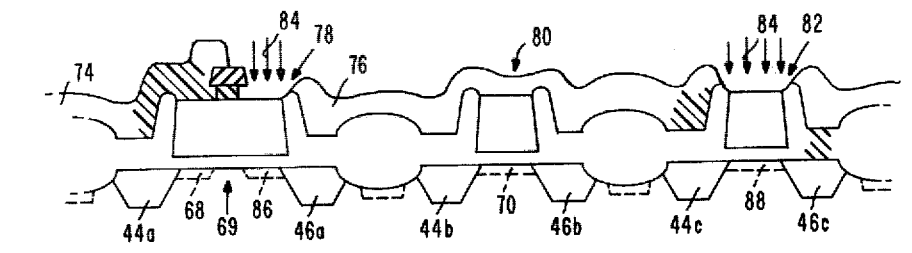
Figure 9:
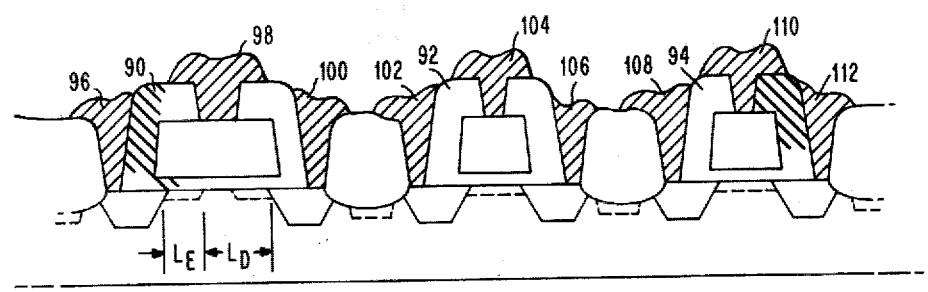

The first process continues by removing the masking photoresist layers 60 and 62 and applying a new photoresist layer 74 and 76 as is shown in FIG. 8. A fourth photolithographic mask is employed to open the window 78 over the polycrystalline silicon layer 32a for the DMOS device and the window 82 over the depletion mode MOSFET device. The edge of the photoresist layer 74 can terminate at any point on top of the silicon nitride layer 56 and the edge of the photoresist layer 76 can terminate at any point on top of the drain diffusion 46a since the distance between the edge 54, the silicon nitride layer 56 and the proximate edge of the drain diffusion 46a for the DMOS device will define the effective opening for the ion implantation of n-type dopant atoms 84 to form the drain extension 86 shown in FIG. 8. Phosphorous ions, for example, are implanted through the windows 78 and 82 to form the depletion channel or drain extension 86 for the DMOS device as is shown in FIG. 8. Simultaneously, the phosphorous ion implantation 84 which passes through the polycrystalline silicon gate layer 32c forms the depletion layer 88 between the source 44c and drain 46c of the depletion mode MOSFET device.

In the diffused MOS device, the drain extension 86 has two doping levels, the low concentration p-type background doping of the original substrate 24 upon which is superimposed the high concentration n-type ionimplanted phosphorous dopant. This combination yields a good quality diffused MOS device characteristic.

At this stage of the first process, all of the threshold voltages have been adjusted to their desired values. To improve the planarity of the wafer, all of the remaining silicon dioxide layers 34 and 58 and all of the remaining silicon nitride layers 36 and 56 are etched away by dipping the wafer in warm phosphoric acid and diluted hydrofluoric acid. Then, a 3000 Å thick layer of silicon dioxide 90, 92 and 94 is deposited as shown in FIG. 9, is treated to become more dense, and is then covered with a phosphosilicate glass stabilizing layer.

A fifth photolithographic mask and conventional etching are employed to open contact holes to all of the source, drain and gate regions for the DMOS, enhancement mode MOS, and depletion mode MOSFET devices. Then an aluminum layer is deposited on all exposed surfaces and a sixth photolithographic mask is employed with etching to define patterns for interconnecting the devices on the wafer and for electrical contacts through the contact holes to the sources, gates and drains of the devices. In this manner, the source contact 96, gate contact 98, and drain contact 100 are respectively connected to the source 44a, the gate 32a, and the drain 46a of the DMOSFET device in FIG. 9. The source contact 102, the gate contact 104, and the drain contact 106 are respectively connected to the source 44b, gate 32b, and drain 46b for the enhancement mode MOSFET device shown in FIG. 9. The source contact 108, the gate contact 110, and the drain contact 112 are respectively electrically connected to the source 44c, the gate 32c and the drain 46c of the depletion mode MOSFET device shown in FIG. 9. The resulting DMOS device shown in FIG. 9 and the first process described in FIGS. 2 through 9 provides an improved, high performance DMOSFET device having a reduced channel length.

In summary, the first disclosed process simultaneously fabricates an improved DMOS device and conventional enhancement mode and depletion mode MOSFET devices on the same semiconductor substrate. The process has the advantages of avoiding more complex bipolar transistor manufacturing process steps. The process does not require extremely high resistivity substrates since the depletion portion 86 of the DMOS device channel can be accurately defined and implanted. Furthermore, conventional enhancement mode and depletion mode MOSFET devices can be simultaneously formed whose channel lengths may be shorter than in the prior art. Still further, the prior art double-diffused DMOS devices are improved upon by the inventive device since a given diffusion rail can be formed out of either the source 44a or the drain 46a which can serve as the source or drain contact depending upon whether the adjacent ionimplanted region is of the enhancement type such as the region 68 or is of the depletion type such as is the region 86. In the prior art DMOS devices, a source diffusion cannot be used as a drain since it is wholly surrounded by the p-type diffusion in the double-diffused structure. Thus the structure shown in FIG. 9 can be formed as a symmetric structure merely by exchanging the locations of the regions 68 and 86. Still further, the source-to-substrate junction capacitance for the DMOS device is reduced by eliminating the p-type diffusion.

The first process described above may be improved upon by the second process to be described below which adjusts the threshold voltages of the DMOS device, the enhancement mode MOS device and the depletion mode MOS device only through the thin gate oxide layer instead of through the composite polycrystalline silicon gate layer and the thin gate oxide layer, so as to improve the control of the resultant concentration of the dopant ions implanted into the substrate. The second process is described with reference to FIGS. 10 through 16.

Figure 10:
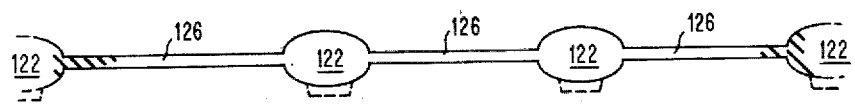
FIGS. 10 through 16 are a sequence of cross-sectional views of a semiconductor structure illustrating a second process embodiment for the invention culminating in a second embodiment for the inventive structure shown in FIG. 16.
Figure 11:
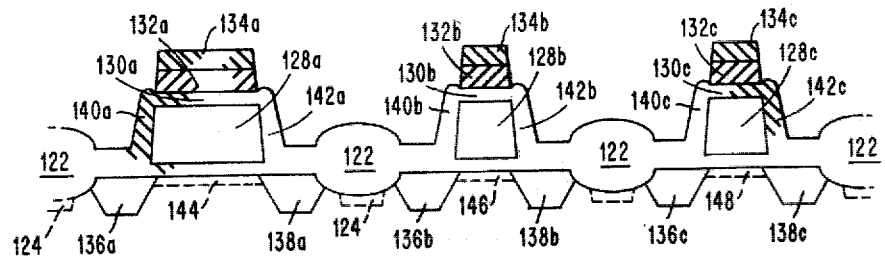
Figure 12:
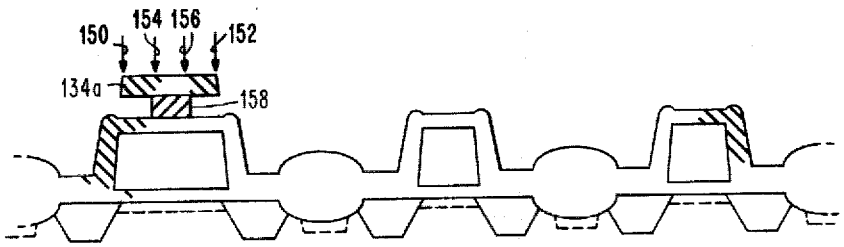
Figure 13:
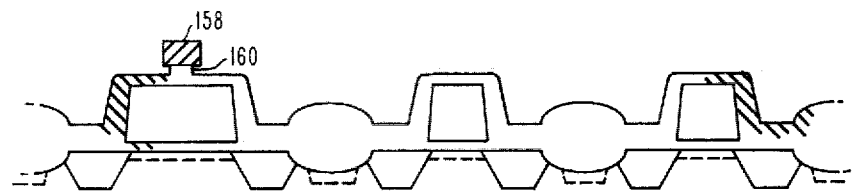

The second process starts in a manner similar to that for the first process as was described with reference to FIG. 2, to produce the field oxide regions 122, gate oxide regions 126, and boron ion-implanted regions 124 in the p-type silicon substrate of FIGS. 10 and 11. A second photolithographic mask is then used to form a photoresist mask over all depletion devices, leaving the entire gate area of the enhancement mode MOS and DMOS devices exposed. Boron ions are then implanted to a sufficient dosage to adjust the value of $V_{TE}$ which is a threshold voltage corresponding to the enhancement mode portion of the devices. A boron ion implantation forms the implanted region 144 for the DMOS device and the implanted region 146 of the enhancement mode MOSFET device as is shown in FIG. 11. A third photolithographic mask is then used over the enhancement mode MOS device and the DMOS device, leaving the entire gate area of the depletion mode MOSFET device exposed, through which a phosphorous ion implantation is carried out with a dosage sufficient to adjust the value of the threshold voltage corresponding to the depletion region 148 in FIG. 11.

The second process continues by repeating the deposition of the layers shown in FIG. 3 resulting in the composite layers of polycrystalline silicon 128 on the gate oxide 126, covered by the silicon dioxide layer 130, which in turn is covered by the silicon nitride layer 132, which in turn is covered by the silicon dioxide layer 134, as is shown in FIG. 11. The second process then continues in a manner similar to that shown for the first process in FIG. 4 by using a fourth photolithographic mask to repeat the step illustrated in the first process with respect to FIG. 4 of etching to define the gate electrode 128a for the DMOS device, the gate electrode 128b for the enhancement mode MOSFET device, and the gate electrode 128c for the depletion mode MOSFET device as is shown in FIG. 11. This step is then followed by the diffusion of n-type impurities through windows formed adjacent to the etched structures in FIG. 11, forming the source region 136a and drain region 138a for the DMOS device, forming the source region 136b and the drain region 138b for the enhancement mode MOSFET device, and forming the source region 136c and the drain region 138c for the depletion mode MOSFET device, shown in FIG. 11. The n-type diffusion operation also results in the formation of the silicon dioxide sidewalls 140a and 142a for the DMOS device, 140b and 142b for the enhancement mode MOS device, and 140c and 142c for the depletion mode MOS device as is shown in FIG. 11.

The second process then continues in a manner similar to that shown with respect to the first process in reference to FIG. 5, by laterally etching the silicon nitride layer 132a in FIG. 11 which begins with lateral edges 150 and 152 and, by virtue of the masking effect of the superincumbent silicon dioxide layer 134a, the silicon nitride layer 132a is etched laterally so that its resultant edges 154 and 156 are precisely defined with respect to the proximate edges of the source region 136a and 138a, respectively. The resultant etched silicon nitride layer is labeled 158 in FIG. 12. The second process then continues by dip etching the wafer in hydrofluoric acid to form the pedestal mask comprised of the composite of the etched silicon dioxide layer 130a which is now labeled 160 in FIG. 13 and the etched silicon nitride layer 158 in FIG. 13.

Figure 14:
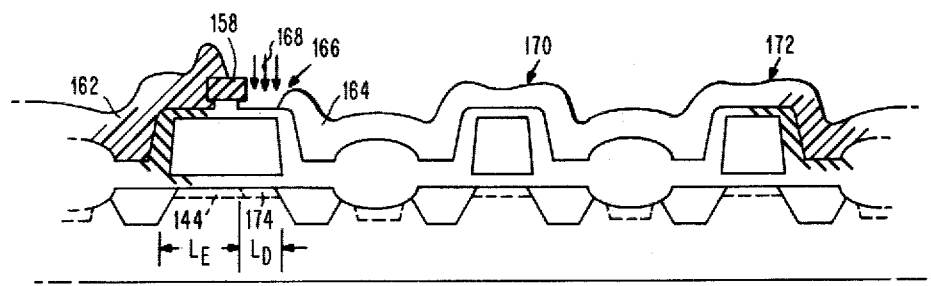

The second process now continues with reference to FIG. 14, where a fifth photolithographic mask is used to form the photoresist blocking mask 162 and 164 over all the enhancement mode MOSFET devices and all the depletion mode MOSFET devices. The edge of the photoresist mask 164 can lie anywhere above the drain diffusion 138a and the edge of the photoresist layer 162 can lie anywhere on top of the silicon nitride layer 158, forming the window 166 over the DMOSFET device. The second process then continues by ion implanting a sufficiently heavy dosage of phosphorous ions 168 through the window 166 to form the depletion region drain extension 174, to compensate for the concentration of the boron implantation 144 in the region adjacent to the drain diffusion 138a. This forms the depletion portion of the DMOS device between the edge 156 of the nitride layer 158 and the proximate edge of the drain diffusion 138a. No implantation is carried out at this point for the enhancement mode MOS device 170 or the depletion mode MOS device 172.

Figure 15:
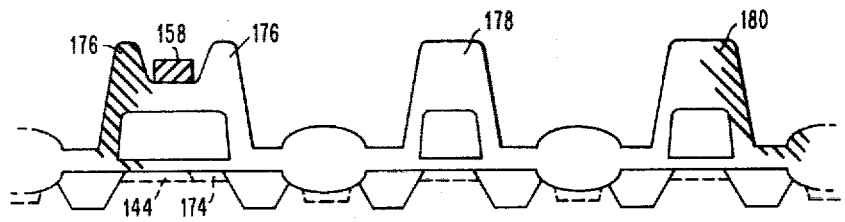
Figure 16:
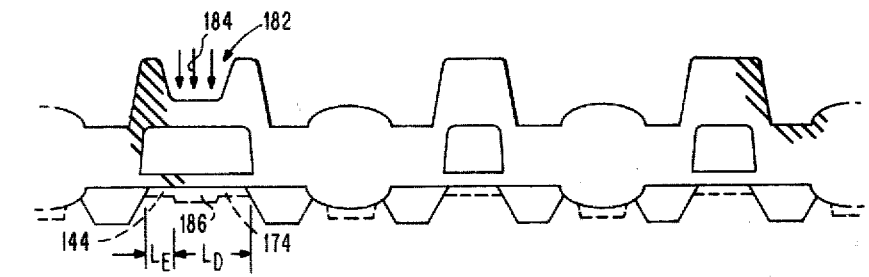

At this stage of the second process, the essential features of the DMOSFET device are now shown in FIG. 14. However, the enhancement portion 144 of the channel is too long. In order to reduce the length of $L_E$ for the enhancement portion of the channel 144, to the dimensions obtained with process 1, the following step, which is not included in the first process, is introduced. After stripping the photoresist mask 162 and 164, the exposed surfaces of the polycrystalline silicon lines are thermally oxidized to form a recessed oxide region surrounding the silicon nitride layer 158 as is shown in FIG. 15. A growth of about 4000 Å of silicon dioxide will consume about 1600 Å of polycrystalline silicon in such a thermal oxidation step, forming the thermal oxide layer 176, 178 and 180 as is shown in FIG. 15. Then, the wafer may be dip etched in warm phosphoric acid to remove the silicon nitride layer 158. This is then followed by a blanket ion implantation of phosphorous ions 184 as is shown in FIG. 16, to form a depletion channel 186 underneath the depression 182 left by the removal of the silicon nitride layer 158. The depletion channel 186 reduces the length $L_E$ of the enhancement portion 144 to approximately the distance between the edges 150 and 154 of the silicon nitride layer 158, previously removed. At this stage, as is shown in FIG. 16, the channel of the DMOSFET device has two well defined regions, an enhancement region 144 whose length is primarily controlled by a lateral etching of the silicon nitride layer 158 and whose threshold voltage $V_{TE}$ is as well controlled as that of the conventional depletion mode MOSFET device, and a second region which is the depletion region whose length $L_D$ and whose threshold voltage $V_{TD}$ are not as well controlled. However, the purpose for making $V_{TD}$ strongly negative in magnitude is to satisfy the inequality described in equation 1 above. Once this inequality is satisfied, the actual value for $V_{TD}$ is not important. Thus, the second process yields an improved diffused MOSFET structure having an improved ion-implanted threshold voltage for the channel midsection 186. The finishing steps for the devices shown in FIG. 16 are identical to those of process 1 with reference to FIG. 9.

In summary, the second process yields an improved DMOSFET device and enhancement mode and depletion mode MOSFET devices with all of the advantages listed for the first process and further advantages as follows. Improved diffused MOSFET current versus voltage characteristics are provided since the portion of the channel 186 and 174 outside the portion 144 is completely implanted into depletion. In addition, the threshold voltage $V_{TE}$ of the enhancement portion 144 is as good as that of the conventional enhancement mode MOSFET device. All of this is achieved with the addition of only one additional photolithographic mask over that required for the first process.

While the invention has been particularly shown and described with reference to the preferred embodiments thereof, it will be understood by those skilled in the art that the foregoing and other changes in form and detail may be made therein without departing from the spirit and the scope of the invention.

Having thus described our invention, what we claim as new, and desire to secure by Letters Patent is:

1. A process for forming an FET device with a precisely defined channel length on a silicon substrate of a first conductivity type on which is deposited a first layer of silicon dioxide, a layer of polycrystalline silicon, a second layer of silicon dioxide, a layer of silicon nitride and a third layer of silicon dioxide, comprising the steps of:

etching said polycrystalline silicon layer, said second oxide layer, said nitride layer and said third oxide layer to form a composite gate structure having a first edge and a second edge defining a channel region for said FET device;

depositing source and drain regions of a second conductivity type opposite to said first conductivity type, aligned with said first and second edges, respectively, in said substrate;

laterally etching said silicon nitride layer beneath said third silicon dioxide layer, forming a reduced size silicon nitride layer having third and fourth edges displaced by a predetermined amount with respect to said first and second edges, respectively;

ion implanting a first conductivity type impurity in said channel region of said substrate having a first end connected to said source region and a second end whose location is juxtaposed with said third edge of said silicon nitride layer, forming an enhancement mode portion of said channel region having a predetermined threshold voltage;

implanting ions of said second conductivity type in said channel region of said substrate having a first end connected with said drain region and a second end whose location is juxtaposed with said fourth edge of said silicon nitride layer, forming a depletion region drain extension in said channel region;

whereby a precisely defined effective channel length is created between said source region and said drain extension.

2. The process of claim 1 wherein said first conductivity type is p-type and said second conductivity type is n-type.

3. A process for forming an FET device with a precisely defined channel length, on a silicon substrate of a first conductivity type partitioned into device areas separated by regions of thick field oxide, a device area having a first layer of silicon dioxide, a layer of polycrystalline silicon, a second layer of silicon dioxide, a layer of silicon nitride and a third layer of silicon dioxide deposited thereon, comprising the steps of:

etching said polycrystalline silicon layer, said second oxide layer, said nitride layer and said third oxide layer to form a composite gate structure having a first edge and a second edge over said device area;

depositing source and drain regions of a second conductivity type opposite to said first conductivity type, aligned with said first and second edges, respectively, in said device area;

laterally etching said silicon nitride layer beneath said third silicon dioxide layer, forming a reduced size silicon nitride layer having third and fourth edges displaced by a predetermined amount with respect to said first and second edges, respectively;

removing said third silicon dioxide layer and ion implanting a first drain extension of said second conductivity type contiguous with said drain region, having an edge defined by said fourth edge of said silicon nitride layer;

growing a fourth silicon dioxide layer around said silicon nitride layer, having edges which are aligned with said third and fourth edges of said silicon nitride layer, and removing said silicon nitride layer;

ion implanting a second drain extension of said second conductivity type which is contiguous with said edge of said first drain extension, having an edge referenced with respect to said third edge of said silicon nitride layer;

whereby a precisely defined channel length is created between said source region and said second drain extension.

4. The process of claim 3 wherein said first type conductivity is p-type and said second conductivity type is n-type.

* * * * *